United States Patent

Raad et al.

[11] Patent Number: 5,586,080
[45] Date of Patent: Dec. 17, 1996

[54] LOCAL WORD LINE PHASE DRIVER

[75] Inventors: George B. Raad; Todd Merritt; Paul S. Zagar, all of Boise, Id.

[73] Assignee: Micron Technology, Inc., Boise, Id.

[21] Appl. No.: 494,535

[22] Filed: Jun. 26, 1995

[51] Int. Cl.⁶ .................................................. G11C 7/00
[52] U.S. Cl. ................................. 365/230.06; 365/230.03
[58] Field of Search ........................... 365/230.03, 230.06

[56] References Cited

U.S. PATENT DOCUMENTS

| | | | |
|---|---|---|---|
| 5,293,343 | 3/1994 | Raab et al. | 365/230.03 X |
| 5,311,478 | 5/1994 | Zagar et al. | 365/230.06 |
| 5,311,481 | 5/1994 | Casper et al. | 365/230.06 |
| 5,333,121 | 7/1994 | Geib | 365/230.03 X |

*Primary Examiner*—Joseph A. Popek
*Attorney, Agent, or Firm*—Schwegman, Lundberg, Woessner & Kluth, P.A.

[57] ABSTRACT

A dynamic integrated circuit memory is described which has memory cells arranged in rows. The memory rows are selectively accessible using an addressing circuit and local phase lines. Distributed local phase driver circuits are used to drive the local phase lines to a pumped voltage which are coupled to the gate of a memory cell access transistor. Addressing circuitry is provided to selectively address the distributed local phase driver circuits.

9 Claims, 6 Drawing Sheets

2

LOCAL WORD LINE PHASE DRIVER

TECHNICAL FIELD OF THE INVENTION

The present invention relates generally to integrated circuit memories and in particular the present invention relates word line drivers therein.

BACKGROUND OF THE INVENTION

A wide variety of integrated circuit memories are available for storing data. One type of memory is the dynamic random access memory (DRAM). A DRAM is designed to store data in a memory cell formed as a capacitor. Because charges on capacitors are dynamic, they must be refreshed periodically to store data. The period between refreshes increases as the initial charge increases. The data is stored in a binary format; a logical "one" is stored as a charge on the capacitor, and a logical "zero" is stored as a discharged capacitor. The typical DRAM is arranged in a plurality of addressable rows and columns. To access a memory cell, a row is first addressed so that all memory cells coupled with that row are available. After a row has been addressed, at least one column can be addressed to pinpoint at least one specific memory cell. The data stored in the memory cells is, therefore, accessible via the columns.

Every memory cell has an access transistor coupled to the memory cell for reading and writing data thereto. Because the memory cell is dynamic, the maximum available voltage should be used to write data to the cell to minimize the frequency of memory refresh cycles. In order to write the maximum voltage into the memory cell, the gate of the access transistor is driven to a pumped voltage level, Vccp. A set of global phase lines are used to connect the access transistors of an entire array to a Vccp voltage pump. Driving one of the global phase lines to Vccp requires excessive operating current. That is, only one row requires Vccp at any given time. The operating current can, therefore, be substantially reduced if only the portion of the global phase line connected to the addressed memory row were driven to Vccp.

For the reasons stated above, and for other reasons stated below which will become apparent to those skilled in the art upon reading and understanding the present specification, there is a need in the art for an integrated memory circuit which provides fast row access times while reducing power consumption by driving local phase lines.

SUMMARY OF THE INVENTION

The above mentioned problems with integrated memory operating current and other problems are addressed by the present invention and which will be understood by reading and studying the following specification. An integrated circuit memory is described which uses distributed local phase driver circuits to drive local phase lines coupled to access devices.

In particular, the present invention describes an integrated circuit memory having a plurality of memory cells. The integrated memory is comprised of a plurality of local phase lines, selectable distributed local phase driver circuits coupled to the local phase lines, and an address decoder circuit for selecting the distributed local phase driver circuits. The memory cells can be arranged in arrays and each one of the distributed local phase driver circuits can be associated with at least one memory array.

In another embodiment, a integrated circuit memory comprises a plurality of memory arrays, a plurality of local phase lines coupled to at least one of the plurality of memory arrays, addressable distributed local phase driver circuits coupled to the plurality of local phase lines, and an address decoder circuit for addressing the distributed local phase driver circuits. The memory arrays can comprise a plurality of memory cells, a plurality of access devices coupled to the plurality of memory cells, and a plurality of word lines coupled to both the plurality of access devices and the plurality of local phase lines.

An integrated circuit memory of another embodiment includes a plurality of memory arrays having a plurality of memory cells arranged in rows, and a plurality of access transistors connected to the plurality of memory cells. A plurality of word lines are connected to the plurality of access transistors, and a plurality of local phase lines are coupled to the plurality of word lines. Addressable distributed local phase driver circuits selectively drive one of the plurality of local phase lines. Finally, an address decoder circuit is included for addressing the distributed local phase driver circuits. This embodiment can include a row decoder circuit for selectively addressing a row of memory. The row decoder can be configured as a tree decode scheme.

In yet another embodiment, a method of accessing a memory cell in an integrated circuit memory is described. The method comprises the steps of addressing a row of memory cells, enabling a local phase line driver, driving a local phase line to a pump voltage, and coupling the local phase line to an access device connected to the memory cell. The method can further including the steps of decoding external address lines, and identifying a memory array where the memory cell is located.

DETAILED DESCRIPTION OF THE INVENTION

In the following detailed description of the preferred embodiment, reference is made to the accompanying drawings which form a part hereof, and in which is shown by way of illustration specific preferred embodiments in which the inventions may be practiced. These embodiments are described in sufficient detail to enable those skilled in the art to practice the invention, and it is to be understood that other embodiments may be utilized and that logical, mechanical and electrical changes may be made without departing from the spirit and scope of the present inventions. The following detailed description is, therefore, not to be taken in a limiting sense, and the scope of the present inventions is defined only by the appended claims.

Figure 1:
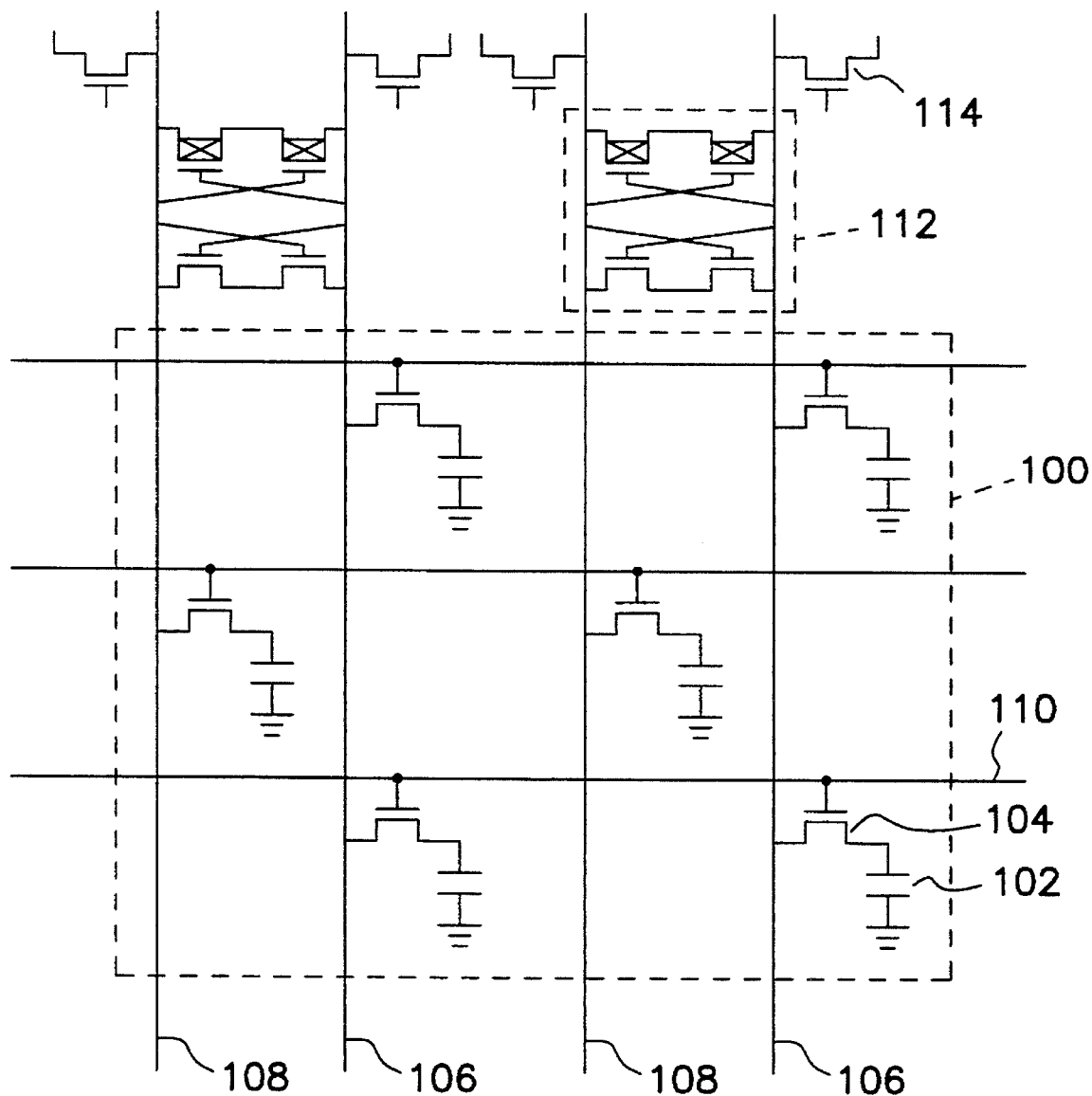
FIG. 1 is a related sensing circuit and memory array.

To understand the present invention a detailed discussion of a related memory is first presented. FIG. 1 is a schematic diagram of a portion of a related dynamic memory array 100. To further describe the invention, the dynamic memory circuit has been simplified. It will be understood to one skilled in the art that additional circuitry not described herein is needed to provide a complete integrated memory circuit. The array comprises a plurality of memory cells 102 which are fabricated as capacitors. The memory cells have one plate connected to a source of an n-channel access transistor 104. The drain of the access transistor is connected to either a digit line 106 or a digit complement line 108. The gate of the access transistor is connected to one of several word lines 110. If one of the word lines has a high voltage, the access transistors connected to that word line are activated and the associated memory cells are coupled to one of the digit lines, 106 or 108. Sense amplifiers 112, as known to one skilled in the art, sense a differential voltage between the digit line pairs and drive the lines to full power rails in response thereto. Column access devices 114 are used to access the digit lines for either reading from or writing to the memory cells.

Figure 2:
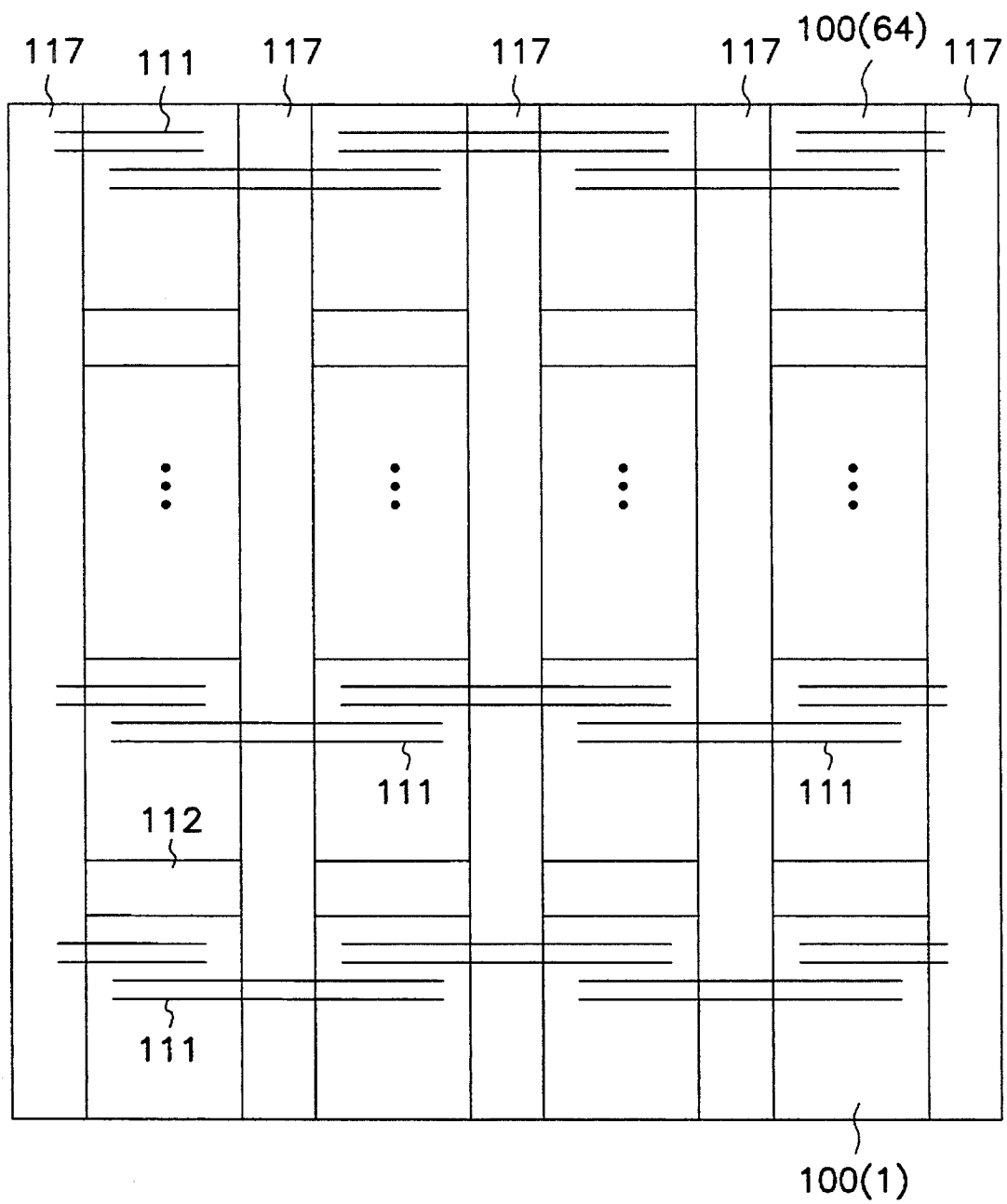
FIG. 2 is a related art memory circuit.

A layout of a related 4 mega bit section of a 16 mega bit DRAM is illustrated in FIG. 2. The 4 mega bit section has 16×4 memory arrays 100 (1)–(64) each having 256 columns and 256 rows. Sense amplifiers 112 are located between adjacent memory arrays 100. Row decoders are located in the gaps 117 between the memory arrays and are used to activate a memory row 111 in response to external row address inputs, as known to one skilled in the art. Global phase lines are also located in the gaps 117 between the memory arrays and used in combination with the row decoders to access a row of memory, as described below. While a 16 mega bit DRAM has been used for illustration, any memory circuit and circuit layout can be used with the present invention.

Figure 3:
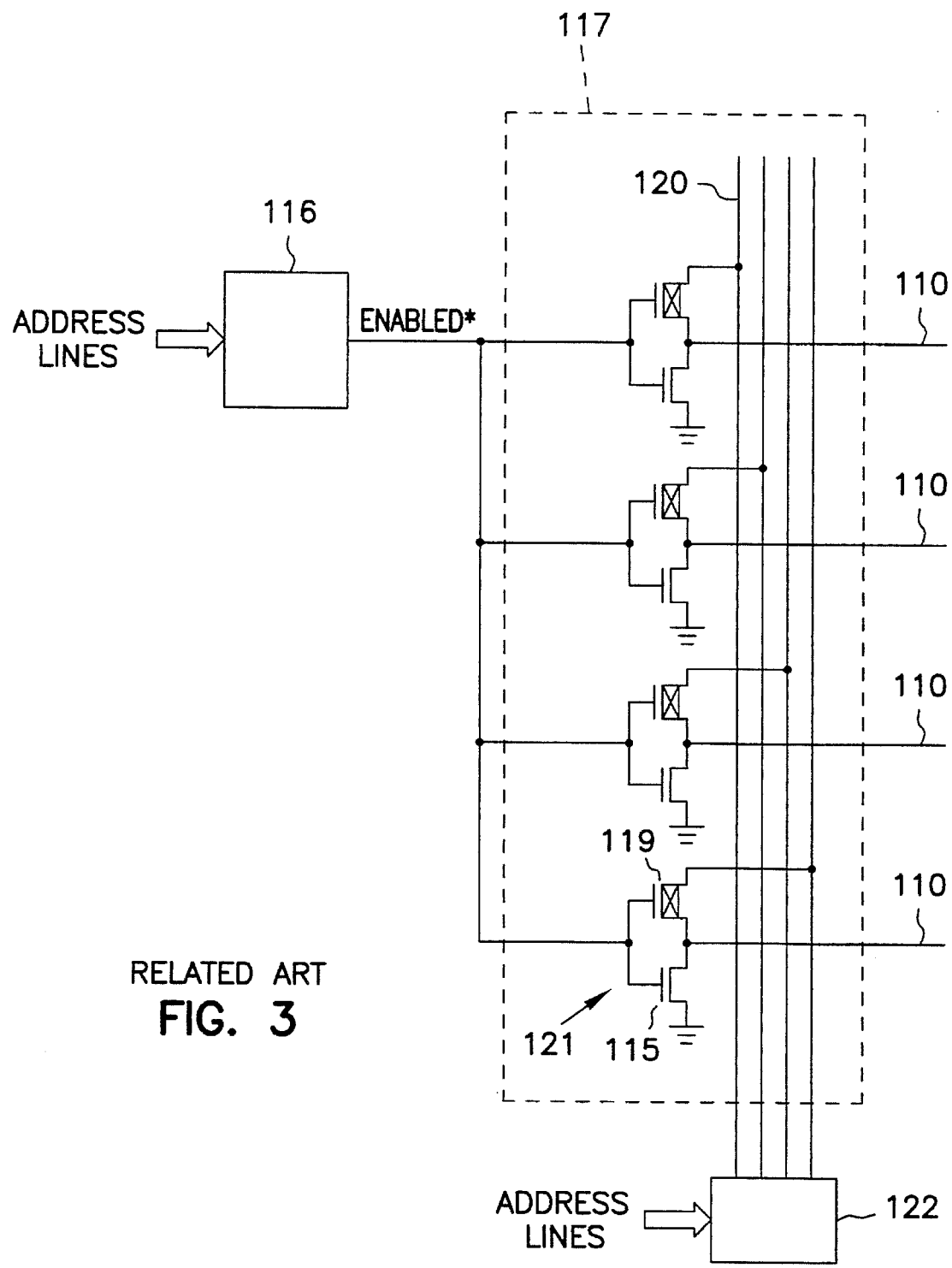
FIG. 3 is a related art row decoder and phase driver.

A more detailed explanation of the row decoders 116 and global phase lines of the related memory of FIG. 2 is presented with reference to FIG. 3. External address lines provided to the memory are received by a row decoder 116 which decodes the address lines to identify a desired memory row address. Because the pitch of the memory row lines is tight, a separate row decoder circuit cannot be provided for each row. Each row decoder, therefore, is used to access a group of memory rows using the ENABLE* signal. By using conventional global phase lines 120, one of the word lines 110 coupled to the group of rows can be connected to a pump supply voltage (Vccp) using word line driver circuits 121. When ENABLE* is low, the p-channel transistor 119 couple word lines 110 to an associated one of the global phase lines 120. If the associated global phase line is connected to a Vccp voltage, the word line activates the access transistor 104 connected to a memory cell 102 (shown in FIG. 1). When ENABLE* is high, n-channel transistors 115 couple the word lines 110 to ground and the access transistors 104 are not activated. A pump voltage, therefore, is needed to drive the gate of an access transistor 104 above Vcc to allow a full Vcc charge to be stored on a memory cell during a write operation. A global phase driver circuit 122 decodes the external address lines and, in response thereto, selectively connects one of the global phase lines to a global Vccp pump circuit. As can be seen, the combination of the row decoder and the phase lines allow one row to be selectively accessed.

It will be understood that the row decoders 116 can be incorporated into one global row decoder which is not located in the gap 117 between arrays sections. Further, additional row decoders can be included to provide different distributed row decoder architectures incorporating different row line lengths. The present invention, therefore, is equally applicable to a memory having either a global row decoder or distributed row decoders.

Figure 4:
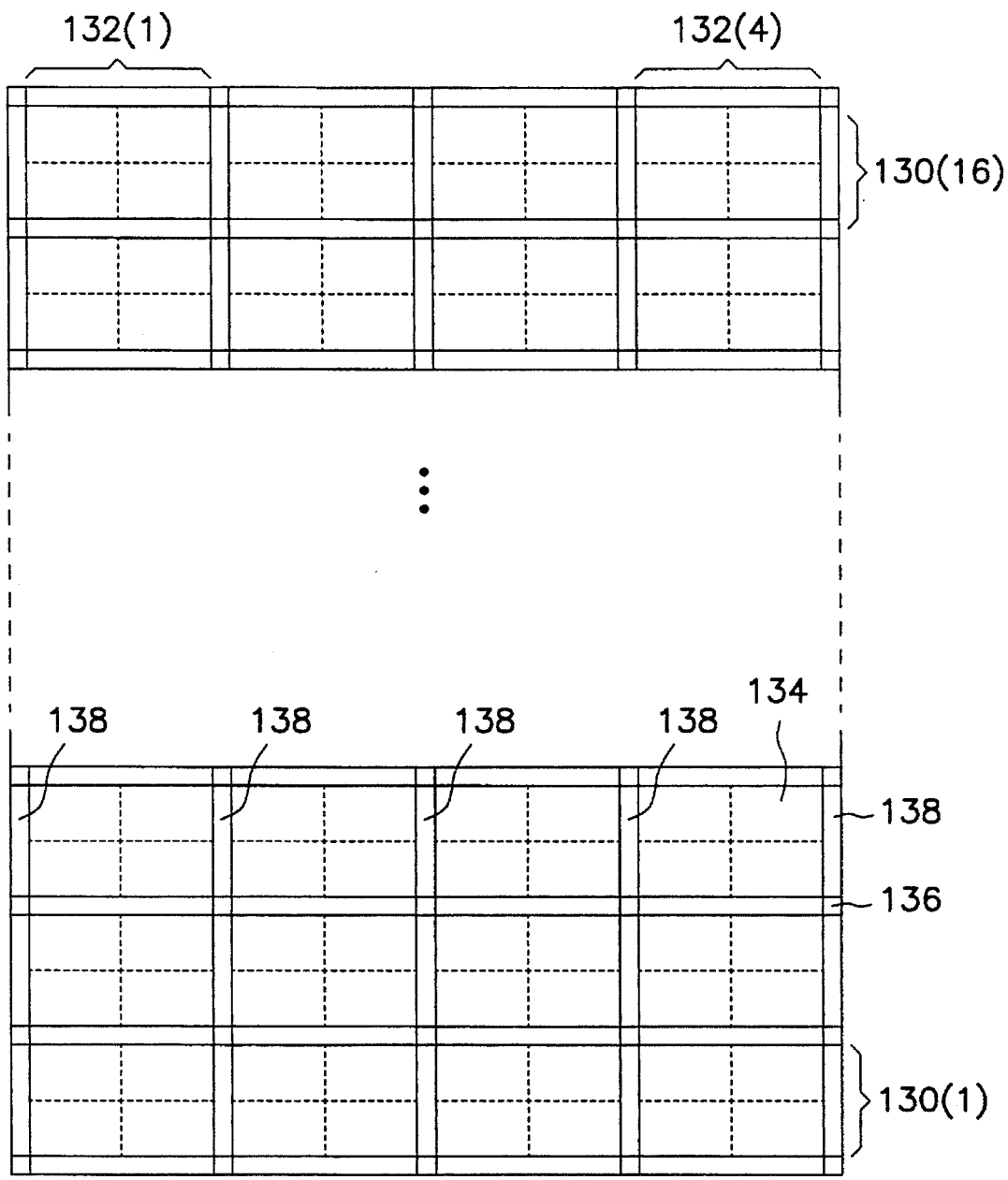
FIG. 4 is a memory circuit of the present invention.

Referring to FIG. 4, an integrated memory circuit is described which has local phase drivers distributed throughout the circuit for driving local phase lines. The present invention is described in reference to a 16 mega bit DRAM, however as stated above, it will be understood that any size and type of memory can include the features of the present invention. Further, only a portion of the entire integrated circuit is described herein for illustrating the present invention, and should not be interpreted as a complete memory circuit, as known to those skilled in the art. A 4 mega bit section of the 16 mega bit DRAM is divided into sixteen array sections 130(1)–(16). Each array section has four arrays illustrated as array columns 132(1)–(4), which are divided into four sub-arrays 134. Local phase drivers 135 (shown in FIG. 6) are distributed throughout the memory and are located in the circuit gaps 136 between the corners of the arrays 132. The local phase drivers are coupled with row decoders which are located in the gaps 138 adjacent the local phase drivers and memory arrays 132.

Figure 5:
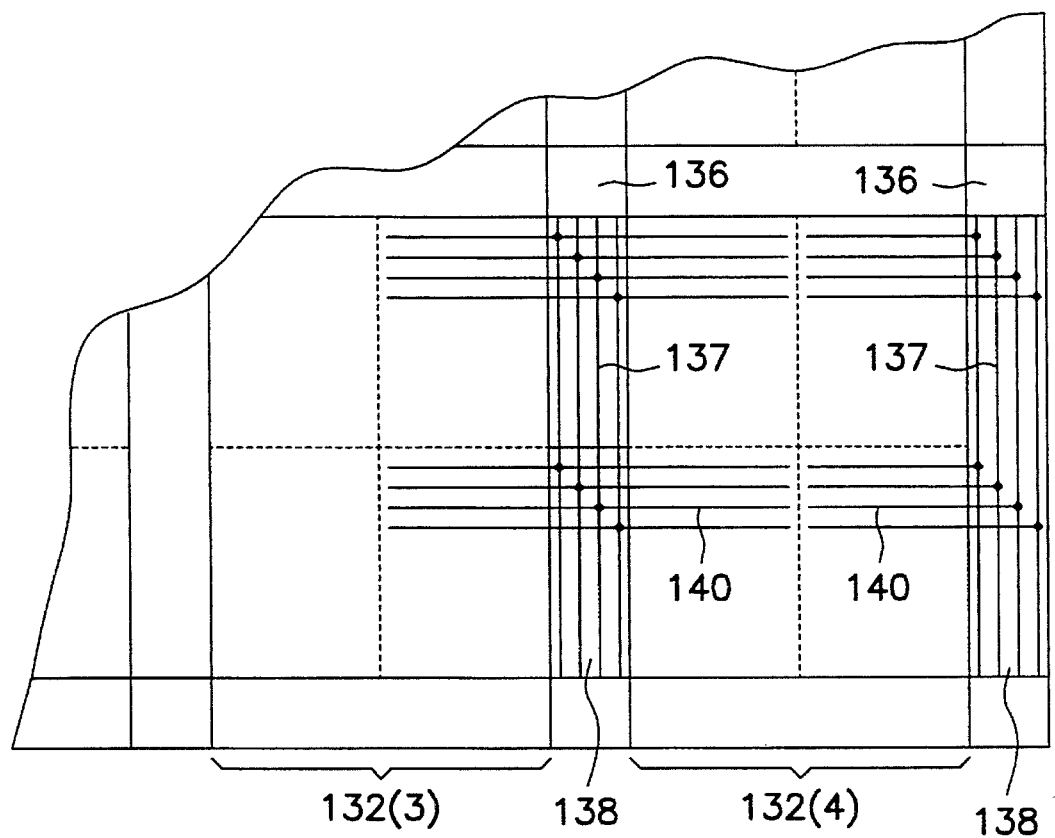
FIG. 5 is a detailed illustration of the memory of FIG. 4.

FIG. 5 shows two adjacent memory arrays of array columns 132(3) and 132(4). Row decoders are located in the gap 138 and connected to at least one-half of the memory rows in a memory array. The row decoders located between two adjacent memory arrays are connected to one-half of both memory arrays, while the local decoders located on the periphery are connected to one-half of one memory array. One local phase line in each of the gaps 138 must be driven to Vccp to fully access the memory cells of a selected row. To reduce operating current, local phase drivers 135 have been distributed throughout the memory and each drive local phase lines 137, or one sixteenth of the total column, as illustrated in FIG. 5. In reference to FIG. 4, the gaps 138 of the memory, therefore, each include row decoders, word line drivers and local phase lines 137. The local phase drivers 135 are located in gaps 136.

When a row of a memory having distributed local phase drivers is addressed, the array section 130(1)–(16) in which the row is located is identified using the external address lines. The five local phase drivers 135 coupled to the identified array section are enabled. The local phase drivers then drive one of the local phase lines 137 to Vccp in response to a command indicating which one of the local phase lines is to be enabled.

Figure 6:
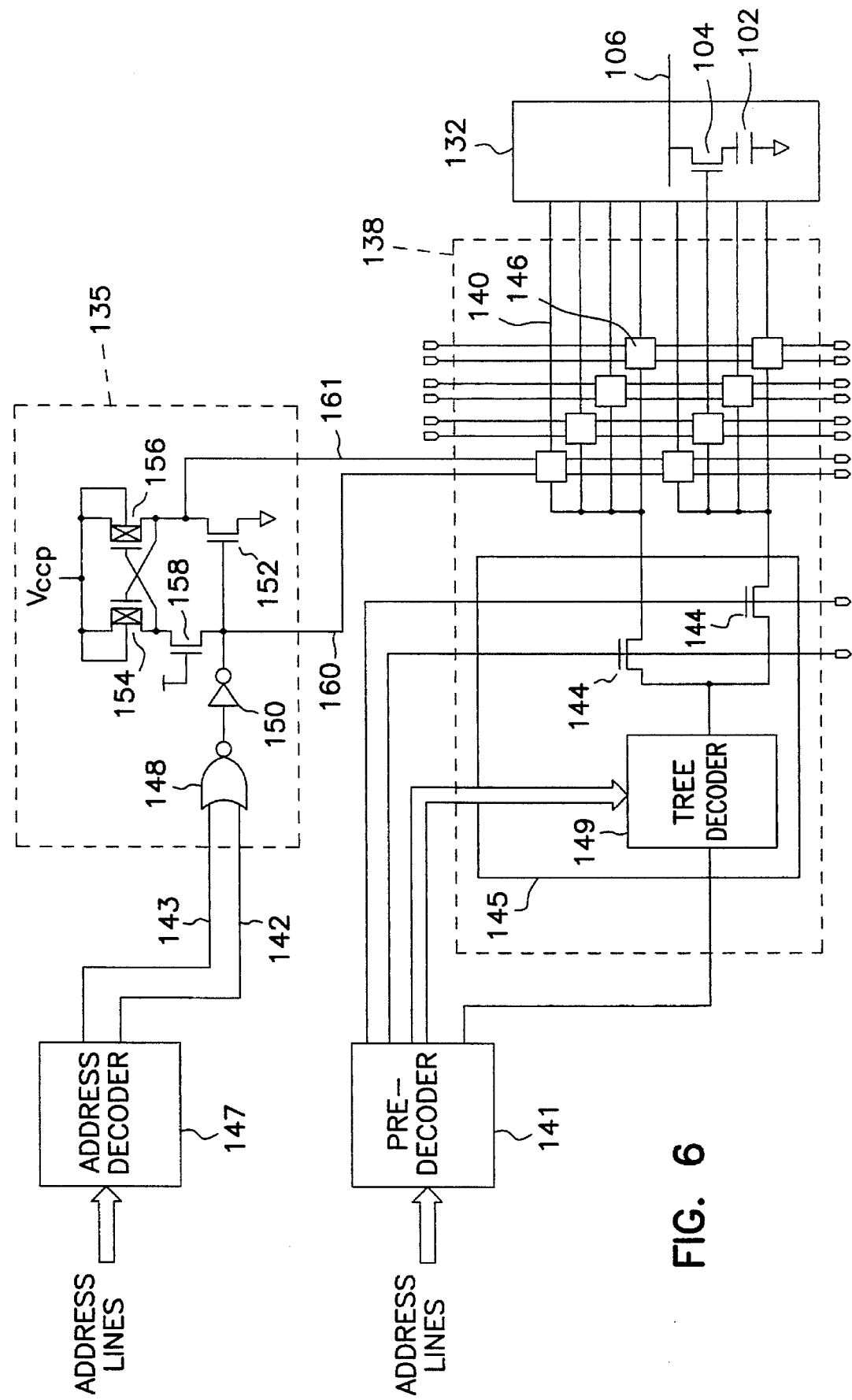
FIG. 6 is a detailed illustration of a local phase driver and row decoder of the memory of FIG. 4.

FIG. 6 shows an address pre-decode circuit 141 and a memory array 132 coupled to circuitry provided in gap 138 and a local phase driver 135. The row decoder 145 includes a tree decode circuit 149 using inputs provided by pre-decode circuit 141. Transistors 144 each enable a group of four word lines 140. Each memory array has 256 rows, however to simplify FIG. 6 for explanation, only the word lines associated with eight rows are shown. Further, for purposes of illustration the row decoder 145 has been simplified. Tree decode circuits include additional circuitry which is not shown, but known to one skilled in the art. Each word line 140 has a word line driver 146 located at the intersection of a pair of local phase lines and one of the word lines. The local phase lines are driven by the local phase driver 135. For each local phase line, the local phase driver has a NOR gate 148 connected to an inverter 150. The output of the inverter is connected to the gate of transistor 152. In operation, a NOR gate 148 of local phase driver receives two inverse logic signals, Array Section Enable* 142 and Phase Select* 143 from an address decoder 147. Both of these signals must be low to drive a local phase line to Vccp. There are sixteen Array Section Enable* lines, each corresponding to one of the sixteen array sections 130(1)–(16). When a memory row is addressed, the array section in which it is located is enabled using the Array Section Enable* lines. The Phase Select* line is used to identify which of the four local phase lines is to be turned on. It will be understood that the number of local phase lines depend upon the addressing scheme chosen for the memory circuit, and is not limited to the four phase line pairs illustrated.

When both the Array Section Enable* 142 line and the Phase Select* 143 line are low, the output of NOR gate 148 is high and the output of inverter 150 is low. The local phase line complement 160 is low and transistor 152 is off. Transistor 158 is activated when the output of the invertor is a threshold voltage below the gate voltage, pulling its source low and activating transistor 156. The local phase line 161 is, therefore, pulled to Vccp such that one of the four word lines 140 is pulled to Vccp.

Although a pre-decoded tree structure is illustrated in FIG. 6 and can be used to address the word lines, it will be understood that any addressing scheme can be used by the row decoder 145 to address the word lines of a memory row. Further, any addressing scheme can be used to enable the local phase driver circuits and is not limited to the addressing scheme which uses address decoder 147 and NOR gates 148. It must also be emphasized that any memory circuit can incorporate the features of the present invention, and the invention is not limited to DRAMs.

Conclusion

A dynamic integrated circuit memory has been described which has memory cells arranged in arrays having memory rows. The memory rows are selectively addressable using an addressing circuit in combination with local phase lines. Distributed local phase driver circuits drive the local phase lines to a pumped voltage (Vccp) which are coupled to word lines, or the gates of memory cell access transistors. Addressing circuitry is described for selectively addressing the distributed local phase driver circuits. Thus, operating current is reduced by driving the local phase lines to Vccp instead of driving the prior global phase lines to Vccp.

What is claimed is:

1. An integrated circuit memory having a plurality of memory cells comprising:

a plurality of local phase lines;

selectable distributed local phase driver circuits coupled to the local phase lines; and an address decoder circuit for selecting the distributed local phase driver circuits.

2. The integrated circuit memory of claim 1 wherein the plurality of memory cells are arranged in a plurality of memory arrays and each one of the distributed local phase driver circuits is associated with at least one of the plurality of memory arrays.

3. An integrated circuit memory comprising:

a plurality of memory arrays;

a plurality of local phase lines coupled to at least one of the plurality of memory arrays;

addressable distributed local phase driver circuits coupled to the plurality of local phase lines; and an address decoder circuit for addressing the distributed local phase driver circuits.

4. The integrated circuit memory of claim 3 wherein the memory arrays comprise:

a plurality of memory cells;

a plurality of access devices coupled to the plurality of memory cells; and a plurality of word lines coupled to both the plurality of access devices and the plurality of local phase lines.

5. An integrated circuit memory comprising:

a plurality of memory arrays having a plurality of memory cells arranged in rows;

a plurality of access transistors connected to the plurality of memory cells;

a plurality of word lines connected to the plurality of access transistors;

a plurality of local phase lines coupled to the plurality of word lines;

addressable distributed local phase driver circuits, each one of the distributed local phase driver circuits being associated with at least one of the plurality of memory arrays for selectively driving one of the plurality of local phase lines; and an address decoder circuit for addressing the distributed local phase driver circuits.

6. The integrated circuit memory of claim 5 further comprising a row decoder circuit for selectively addressing the plurality of word lines.

7. The integrated circuit memory of claim 6 wherein the row decoder circuit is configured as a tree decode scheme.

8. A method of accessing a memory cell in an integrated circuit memory, the method comprising the steps of:

addressing a row of memory cells;

enabling a local phase line driver;

driving a local phase line to a pump voltage; and coupling the local phase line to an access device connected to the memory cell.

9. The method of claim 8 further including the steps of:

decoding external address lines; and identifying a memory array where the memory cell is located.

* * * * *